US010014264B2

(12) United States Patent
Gremillet et al.

(10) Patent No.: US 10,014,264 B2
(45) Date of Patent: Jul. 3, 2018

(54) HYPERFREQUENCY HOUSING OCCUPYING A SMALL SURFACE AREA AND MOUNTING OF SUCH A HOUSING ON A CIRCUIT

(71) Applicant: THALES, Courbevoie (FR)

(72) Inventors: Patrick Gremillet, Elancourt (FR); Bernard Ledain, Elancourt (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 15/527,666

(22) PCT Filed: Nov. 18, 2015

(86) PCT No.: PCT/EP2015/076895
§ 371 (c)(1),
(2) Date: May 17, 2017

(87) PCT Pub. No.: WO2016/107692
PCT Pub. Date: Jul. 7, 2016

(65) Prior Publication Data
US 2017/0345778 A1    Nov. 30, 2017

(30) Foreign Application Priority Data

Dec. 30, 2014 (FR) .................................. 14 03029

(51) Int. Cl.
*H01L 23/60* (2006.01)
*H01L 23/31* (2006.01)
*H01L 23/498* (2006.01)
*H05K 1/02* (2006.01)
*H05K 3/34* (2006.01)

(52) U.S. Cl.
CPC .......... *H01L 23/60* (2013.01); *H01L 23/3114* (2013.01); *H01L 23/49805* (2013.01); *H01L 23/49816* (2013.01); *H01L 23/49833* (2013.01); *H05K 1/0243* (2013.01); *H05K 3/3436* (2013.01)

(58) Field of Classification Search
CPC . H01L 23/552; H01L 23/49838; H01L 23/60; H01L 23/49816; H01L 23/3114; H01L 2924/3025; H01L 23/49833; H05K 3/284; H05K 1/0243; H05K 3/3436
See application file for complete search history.

(56) References Cited

U.S. PATENT DOCUMENTS

| 6,297,551 B1 * | 10/2001 | Dudderar | .............. H01L 23/055 257/686 |
| 6,333,552 B1 * | 12/2001 | Kakimoto | ............ H01L 23/552 257/678 |
| 2012/0018858 A1 * | 1/2012 | Chen | ..................... H01L 21/565 257/659 |

FOREIGN PATENT DOCUMENTS

| EP | 0 872 888 A2 | 10/1998 |
| EP | 1 657 749 A2 | 5/2006 |

(Continued)

*Primary Examiner* — Jasmine Clark
(74) *Attorney, Agent, or Firm* — Baker & Hostetler LLP

(57) ABSTRACT

A package, able to encapsulate at least one component, forming a closed cavity of Faraday cage type having side walls resting on a base and that are surmounted by a cover, wherein at least one of the side walls includes exterior electrical connection elements linked electrically to the interior of the cavity, the exterior connection elements able to interconnect with an exterior circuit such that the side wall faces the exterior circuit when the exterior connection elements are interconnected with the circuit.

15 Claims, 4 Drawing Sheets

(56) References Cited

FOREIGN PATENT DOCUMENTS

FR 2 849 346 A1 6/2004
FR 2 877 537 A1 5/2006

\* cited by examiner

HYPERFREQUENCY HOUSING OCCUPYING A SMALL SURFACE AREA AND MOUNTING OF SUCH A HOUSING ON A CIRCUIT

CROSS-REFERENCE TO RELATED APPLICATIONS

This application is a National Stage of International patent application PCT/EP2015/076895, filed on Nov. 18, 2015, which claims priority to foreign French patent application No. FR 1403029, filed on Dec. 30, 2014, the disclosures of which are incorporated by reference in their entirety.

FIELD OF THE INVENTION

The present invention relates to an RF frequency package occupying a small surface area. It also relates to an assembly of such a package on a circuit of multilayer type.

It applies in particular to the field of the encapsulation of RF frequency components surface-mounted on multilayer circuits. These RF frequency components are used for example in radar, avionic, space or telecommunications applications.

BACKGROUND

The encapsulation of RF frequency components or functions has a plurality of objectives with regard to the external environment. In particular, it provides physical protection, electromagnetic protection and enables electrical interconnection with the exterior, in particular for linking them electrically to other components, to control signals and power supply sources via printed circuits.

A certain number of encapsulation techniques enable these objectives to be fulfilled in a more or less effective manner.

One of these techniques is known under the name "Ball Grid Array", generally termed BGA technique. This technique consists of a package, the interconnection of which to the printed circuit is ensured by metal balls situated in a plane parallel to the surface of the components. One solution designed for RF frequency components, with a package ensuring good electromagnetic protection with regard to the exterior environment, is described in document FR 2 849 346.

One drawback of this solution is that the package has a large surface area, since it needs to comprise the components, but also their intermediate interconnection and the walls of the package.

Now, applications exist that impose severe spatial restrictions, such as for example transmitter and receiver modules of active type in which the grid is linked with the wavelength of the transmitted signals. In these cases in which the surface area available to receive the encapsulated components is restricted, the above solution is difficult to use. One known solution for overcoming this restriction problem is to use packages having a plurality of stages, thus reducing the surface area occupied on the printed circuit. Such a solution is in particular described in document FR 2 877 537. One drawback of this solution lies in the fact that it complicates the internal interconnection of the package.

SUMMARY OF THE INVENTION

One aim of the invention is in particular to mitigate the abovementioned drawbacks, and to enable the production of RF frequency packages occupying a small surface area. To this end, one subject of the invention is a package, able to encapsulate at least one RF frequency component, forming a closed cavity of Faraday cage type having side walls resting on a base and that are surmounted by a cover, at least one of said side walls including exterior electrical connection elements linked electrically to the interior of said cavity, said exterior connection elements being able to interconnect with an exterior circuit such that said side wall faces said exterior circuit when said exterior connection elements are interconnected with said circuit.

In one particular embodiment, said exterior connections are conductive balls.

Said side wall is composed for example of an insulating material covered on the exterior side with a layer comprising a plurality of conductive surfaces that are insulated electrically from one another and covered on the interior side with a single conductive surface, said exterior connection elements ($8a$, $8b$) being fixed on said conductive surfaces.

Said connection elements form for example a monolithic block with said conductive surfaces.

With the base including an exterior conductive surface forming a ground, a conductive surface of said side wall is for example linked electrically to said surface forming a ground.

One or a plurality of exterior connection elements are for example each linked electrically to the interior of said cavity by a metalized hole, said metalized hole being linked electrically by one end to the exterior connection element and by another end to an interior conductive surface of said base.

Said base includes for example an interior conductive surface forming a pad for receiving said at least one component and able to be linked electrically to its ground, said interior surface being linked electrically to the exterior surface of said base by at least one metalized hole passing through the insulating material of said base, the signal inputs and outputs of said component being connected to an interior surface of said base linked electrically to the exterior connection elements.

In another possible embodiment, said base includes a part without insulating material so as to enable the mounting of said at least one component directly on the exterior conductive surface.

At least one other side wall is for example composed of an insulating material covered with at least one conductive layer.

At least one other wall includes for example at least one receiving pad suitable for the mounting of at least one component, the inputs and outputs of said component being linked electrically to an interior conductive surface of said base, which is itself linked electrically to the exterior connection elements.

In another possible embodiment, the other side walls are made entirely of metal.

The cover is for example composed of an insulating material covered with at least one conductive layer.

The cover includes for example at least one receiving pad suitable for the mounting of at least one component, the inputs and outputs of said component being linked electrically to an interior conductive surface of said base, which is itself linked electrically to the exterior connection elements.

In another possible embodiment, the cover is made entirely of metal.

One subject of the invention also relates to an assembly comprising a package such as described previously and a multilayer circuit including at least one ground plane and conductive tracks, at least one metalized hole being produced in said circuit facing an exterior connection element of said package linked electrically to the ground of said at least one component, the exterior connection elements being linked to said conductive tracks, said package being mounted such that the plane of said base of said package is perpendicular to the plane of said circuit.

BRIEF DESCRIPTION OF THE DRAWINGS

Other features and advantages of the invention will become apparent with the aid of the following description, given with reference to appended drawings, in which.

DETAILED DESCRIPTION

Figure 1:
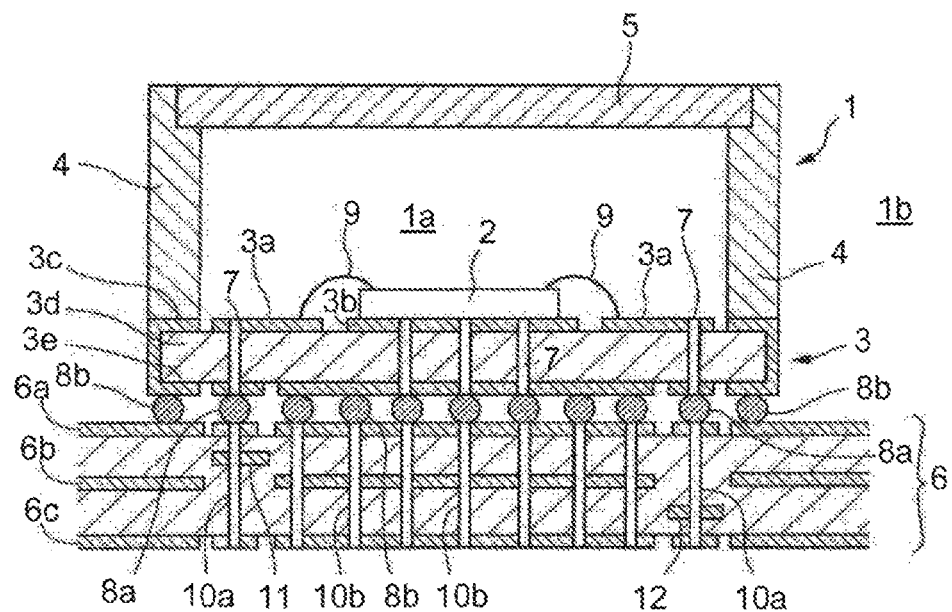
FIG. 1 shows an example of an RF frequency package according to the prior art.

FIG. 1 recaps an RF frequency package solution, of BGA type, according to the prior art, with a cross-sectional view. The package 1 makes it possible to delimit an interior volume 1a. A base 3 forms the bottom of the package. The base is intended to be mounted on an exterior circuit 6, for example of the multilayer type. The base 3 may be a printed circuit comprising two conductive layers. Of course, the printed circuit forming the base may comprise a different number of conductive layers. The circuit forming the base 3 may be produced by using an insulating material that is preferably organic. This insulating material may be metalized by copper for example in order to form the two conductive layers. In other words, the circuit comprises a thickness of insulating material 3d on which are deposited conductive layers on either side of the insulating thickness.

The first conductive layer forms an interior face of the package 1. This layer comprises conductive surfaces 3a, 3b, 3c etched using methods known to those skilled in the art.

In this example, the second conductive layer may form an exterior face of the package. It essentially comprises a single conductive surface 3e. This conductive surface 3e almost entirely covers the whole surface of the base 3 while forming a ground. This ground is intended to be linked electrically to the exterior circuit 6.

The package furthermore includes a conductive structure 4, 5 that forms, with the surface 3e, a Faraday cage surrounding the interior volume 1a of the package. The interior volume 1a is thus protected against exterior electromagnetic disturbances. The conductive structure may be formed by a metalized cover. The conductive structure is for example formed by metal walls 4 covered with a metal plate 5. The metal plate 5, the walls 4 and the base 3 may be soldered.

By way of example, what is presented is an RF frequency component 2 mounted in the package 1, such a package being able to contain a circuit with a plurality of components. The ground of the component is in contact with a conductive surface 3b of the interior layer of the base 3. The RF frequency component may be a bare chip, for example. This chip may be soldered or bonded with a conductive glue on the conductive surface 3b. The conductive surface 3b is linked electrically to the exterior layer 3e by one or a plurality, preferably a plurality, of metalized holes 7. An RF frequency ground is thus produced. The metalized holes 7 are plugged in order to ensure the leaktightness of the package 1.

The RF frequency and low frequency inputs and outputs of the chip 2 are linked to tracks 3a of the interior layer of the base 3, for example with conductive wires 9. Each track 3a is for example linked electrically to a disk, not shown, of the exterior layer of the base 3. This electrical link is produced by metalized signal holes 7 passing through the base 3 routing the RF frequency signals and the low frequency signals, respectively, the metalized holes 7 being plugged in order to ensure the leaktightness of the package 1.

Conductive balls 8a are situated in contact with the metalized holes 7, directly or by means of disks that are not shown. These conductive balls 8a form an integral part of the package. They then form the connection points of the package. The conductive balls 8a may be balls of tin-lead, for example. They have the advantage of not deforming during the mounting of the package on the exterior circuit 6, thereby making it possible to control the distance between the package 1 and the circuit 6. The balls 8a may be soldered or bonded, preferably soldered, on the circuit 6.

The interior conductive layer may comprise a conductive surface 3c. The conductive surface 3c is linked electrically to the exterior conductive layer 3e by metalized holes that are preferably plugged. These metalized holes are for example distributed in a regular mesh. The conductive tracks 3a intended to transmit RF frequency signals are for example situated in recesses in the conductive surface 3c so as to shield these tracks in the plane of these tracks (interior layer).

Metalized ground holes, not shown, link the interior conductive surface 3c electrically to the exterior conductive layer 3e, these holes being for example plugged in order to ensure the leaktightness of the package 1. They are distributed at the periphery of the metalized RF frequency signal holes 7. In this way, RF frequency shielding is produced in the thickness of the base 3, that is to say in the insulating thickness 3d. Advantageously, these metalized holes number at least three per metalized RF frequency signal hole 7. They are preferably distributed over 360° so as to form complete shielding.

Conductive ground balls, not shown, are for example situated at the output of the metalized ground holes. These conductive balls form an integral part of the package 1. In this way, a coaxial structure is formed that shields the connections between the RF frequency input-output and the circuit 6. In other words, shielding is produced at the level of the connection itself, that is to say in the space between the package and the circuit 6.

Other conductive balls 8b, forming an integral part of the package 1, may be situated in order to link the conductive surface 3e electrically to the ground of the circuit 6. These conductive balls 8b are not necessarily in the extension of the metalized holes formed in the base 3.

The diameter of the balls (ground balls and RF frequency or low frequency signal balls), the diameter of the metalized holes, the distance between a signal ball and the ground balls surrounding it, and the number of ground balls, are for example determined in order to obtain a controlled impedance, for example of 50 ohms.

FIG. 1 presents an example of a circuit on which the package 1 may be mounted. In this example, the circuit 6 is a multilayer circuit. This circuit 6 comprises at least one conductive ground plane 6a. A metalized hole 10a is produced in the multilayer circuit facing the connection point 8a of the package 1, so as to route the signal through the conductive ground plane 6a. The signal arrives by way of the metalized hole 10a at a track 11, for example, the track and the ground plane forming a structure making it possible to propagate an RF frequency signal.

The circuit comprises a second conductive ground plane 6b situated under the track 11. In other words, the circuit 6 comprises two RF frequency ground layers 6a, 6b between which an RF frequency signal propagates. A shielded structure is thus formed.

With part of the signal being routed between the ground planes 6a and 6b, at least one connection, for example, is created to another layer of the circuit 6 situated under the ground plane 6b. It is thus possible to propagate RF frequency signals in different layers 11, 12 of the circuit 6.

A third ground plane 6c is for example situated under the layer 12. Of course, the multilayer circuit 6 may have a different configuration. It may include more ground planes and more layers propagating RF frequency or low frequency signals.

The ground balls of the package are for example linked to the ground plane 6a. They may also be linked to the other ground planes by metalized holes. The conductive ground planes of the circuit are for example linked to one another by metalized holes 10b. RF frequency shielding is thus formed in the thickness of the circuit.

The package illustrated in FIG. 1 exhibits very good performance, in particular in terms of electromagnetic performance and withstanding mechanical and environmental stresses. However, it occupies a large surface area. Specifically, it has a large surface area as it needs to comprise the components, their intermediate interconnection and its walls.

This large surface area may be problematic. This is the case in particular when the surface area available to receive the encapsulated components is restricted, such as for example in transmitter and receiver modules of active type, in which the grid is linked with the wavelength of the transmitted signals.

One known solution for reducing the surface area occupied on the printed circuit is to produce the RF frequency function encapsulated in the package over a plurality of stages. However, this solution is complex to implement.

Figure 2A:
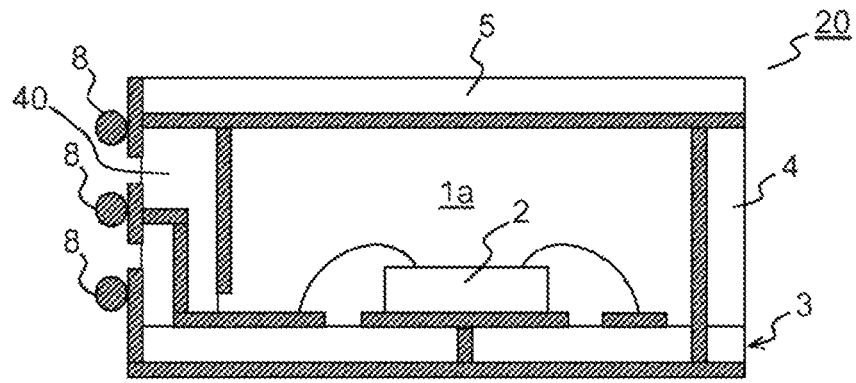
FIGS. 2a and 2b show an illustration of the principle of the production of a package according to the invention.
Figure 2B:
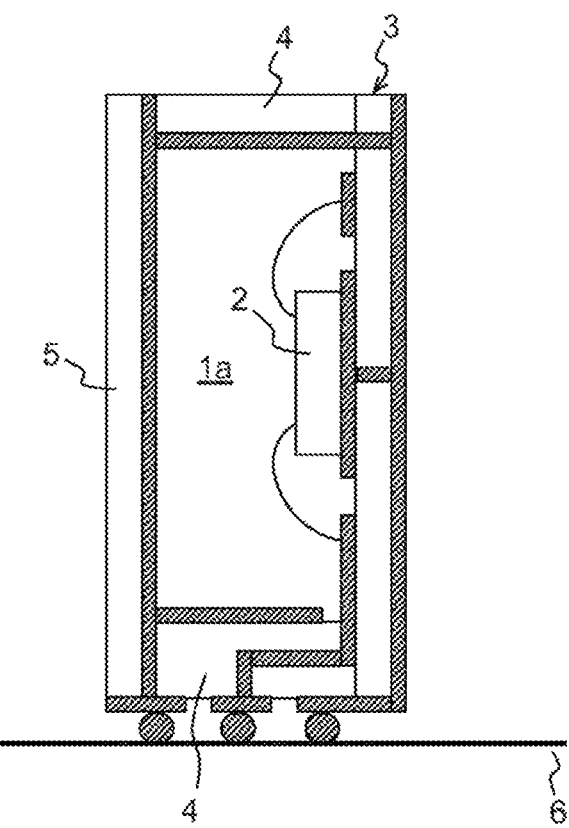

FIGS. 2a and 2b illustrate the principle of producing an RF frequency package according to the invention. The package 20 forms a cavity 1a resting on a base 3 on which the component(s) 2 to be encapsulated are interconnected on the interior side, the base being surrounded by side walls 4, at least one of which 40 contains electrical connections 8 linked on one hand, toward the interior of the cavity, to the base 3 and on the other hand, toward the exterior of the cavity, to external connection points, the walls being closed on the side opposite to the base by a cover 5.

The structure of the base 3, of the cover 5 and of the walls 4, with the exception of the wall 40 equipped with electrical connections 8, are for example the same as those of the package described by FIG. 1. As in the case of FIG. 1, the example of the package that is described hereinafter comprises a single RF frequency component 2 on the base.

A package according to the invention is therefore a package whose interconnection is ensured by connections, for example metal balls 8, situated on one of the walls and therefore in a plane perpendicular to the surface of the components 2. In this way, the package is held perpendicularly to the surface of the printed circuit 6, as illustrated in FIG. 2b. The surface area taken up by the package on the printed circuit is thus that of one of the walls, and is no longer restricted by the surface area of the components and of their intermediate connection. By way of example, for a package having a length L and a width I of the order of 6 mm and a height h of the order of 1 mm, the surface area used for implantation on the printed circuit is therefore L×I=6 mm², instead of L×I=36 mm². This solution is designed in particular for packages including a small number of balls, and therefore simple functions such as those that may be encountered in the RF frequency field.

Another advantage of the invention is that it makes it possible to ensure good thermal contact with a radiator more easily, by situating the latter against the base 3 of the package.

Figure 3:
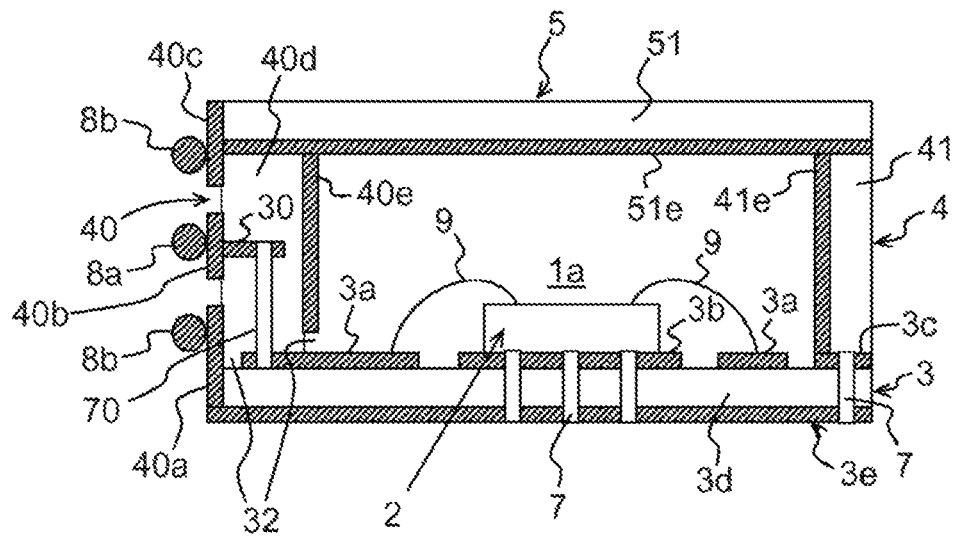
FIG. 3 shows an exemplary embodiment of a package according to the invention.

FIG. 3 presents a first possible exemplary embodiment of a package according to the invention. In this example, the base 3 supporting the component 2 is a printed circuit including a thickness of insulating material 3d on either side of which are deposited conductive layers. The interior conductive layer comprises a plurality of conductive surfaces 3a, 3b, 3c. The exterior conductive layer essentially comprises a single conductive surface 3e. This conductive surface entirely, or almost entirely, covers the whole surface of the base 3 while forming a ground, this ground being intended to be linked electrically to the exterior circuit 6, for example a printed circuit of the type presented in FIG. 1. To this end, this conductive layer is extended by a conductive surface 40a covering an external part of the wall 40 equipped with electrical connections. The electrical connections are for example balls 8a, 8b. At least one ball 8b is fixed on this parietal conductive surface 40a, by soldering or by bonding, for example. The electrical linking of the ground layer 3e to the circuit 6 is therefore carried out by way of the parietal conductive surface 40a and of the metal ball 8b. A single ball 8b is shown in FIG. 3. In practice, one or a plurality of rows of metal balls may be used, depending on the encapsulated RF frequency function and on the space available. The conductive balls form for example an integral part of the wall 40, and more particularly form a monolithic block with the conductive surfaces 40a, 40b, 40c of the wall.

The package includes a conductive structure that forms, with the ground surface 3e of the base, a Faraday cage surrounding the interior volume 1a of the package. This conductive structure is formed by the wall 40 equipped with electrical connections 8a, 8b, by the other walls 4 and by a cover 5. Embodiments of the cover 5 and of the other walls will be described hereinafter. The description of the wall 40 equipped with electrical connections is continued in relation to its interconnection with the component 2.

This wall 40 is composed of a dielectric insulating material 40d, covered on either side with a conductive layer. An internal conductive layer 40e completes the conductive structure forming a Faraday cage. On the exterior side, the wall 40 includes a conductive layer composed of a plurality of surfaces. A first surface 40a extending the ground layer 3e of the base has already been described. Another surface 40c is linked electrically to the cover 5. Said surface includes for example at least one metal ball 8b making it possible to link the cover electrically to the external circuit 6, in particular to the ground potential as is the case for the layer 3e of the base. A single ball 8b is shown in FIG. 3; in practice, this surface 40c includes a plurality of balls distributed in one or a plurality of rows as is the case for the other surface 40a. In order to describe a third layer 40b, we return to the connection of the RF frequency component 2.

The ground of the component is in contact with a surface 3b of the first layer of the base 3, this surface 3b forming a pad for receiving the component. This component may be a bare, soldered or bonded chip. This surface 3b is itself linked to the ground layer 3e of the base by one or a plurality of metalized holes 7, thus making it possible to link the ground of the component to the ground potential of the external circuit 6 via the conductive surface 40a extending the ground layer 3b.

The RF frequency and low frequency inputs and outputs of the component 2 are linked to conductive tracks 3a of the interior layer of the base 3, for example by conductive wires. The conductive tracks 3a are linked to parietal metal balls 8a by way of metalized holes 70 produced in the interior of the insulating material 40d of the wall 40, these metalized holes linking the tracks 3a electrically to the parietal metal balls 8a. To this end, the conductive tracks 3a extend under the wall 40, more particularly under the dielectric 40d. A minimum space 32 is provided in order to prevent any electrical contact between the conductive tracks 3a and the other internal 40e or external 40a layers.

Likewise, a conductive element 30, linked electrically to a parietal surface 40b, penetrates the dielectric. At least one metalized hole 70 links this conductive element 30 electrically to the conductive track 3a. The parietal surface 40b thus linked electrically to the conductive track 3a includes one or a plurality of metal balls 8a. All of the connections to the external circuit 6 are made through these parietal balls 8a, 8b conveying either the RF frequency signals or the low frequency signals or the ground potential.

In the exemplary embodiment of FIG. 3, the other walls 4 are also formed of an insulating material 41 covered with a conductive internal layer 41e. The cover 5 is also formed of an insulating material 51 covered with a conductive layer 51e. The conductive layers 41e are for example linked to a conductive surface 3c of the internal layer of the base, this conductive surface 3c being linked to the ground layer of the base by a metalized hole 7. Shielding of the type produced in the package of FIG. 1 is for example produced for the package according to the invention such as described by FIG. 3.

The insulating parts 3d, 40d, 41, 51 of the package are for example produced with a substrate having a controlled dielectric constant and a low loss tangent, for example based on ceramic, Teflon or hydrocarbon filled with glass fiber or with silica powder. The conductive layers may be produced with copper. The conductive balls may be produced with a tin-based alloy.

Figure 4:
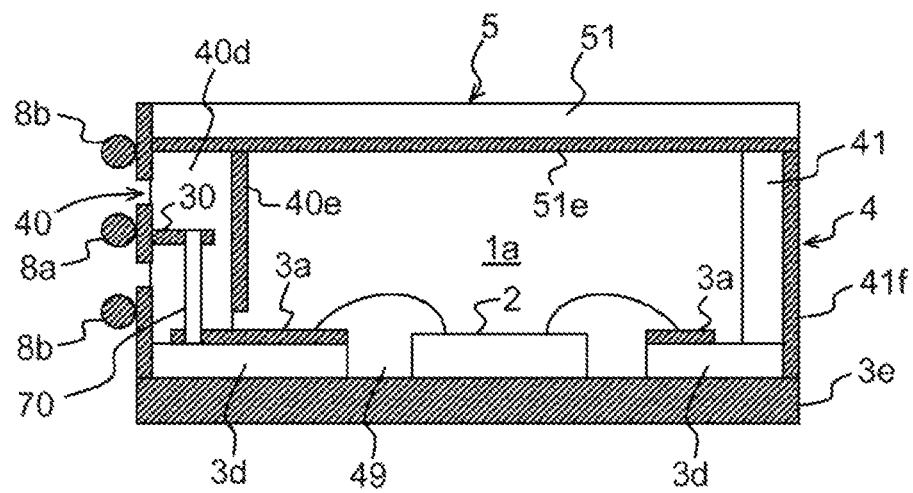
FIGS. 4, 5 and 6 show other possible exemplary embodiments of a package according to the invention.

FIG. 4 presents a variant embodiment in which the component 2 to be encapsulated is situated directly on a conductive metal surface 3e in order to facilitate heat dissipation. This metal surface is the exterior conductive surface 3e of the base. In this case, the base 3 includes a part 49 without insulation in order to enable the mounting of the component directly on the metal surface 3e. The thickness of this metal surface 3e is sufficient to ensure the mechanical strength of the entire package. The conductive layer 41f covering the insulating materials 41 of the walls 4 is for example situated on the exterior side.

Figure 5:
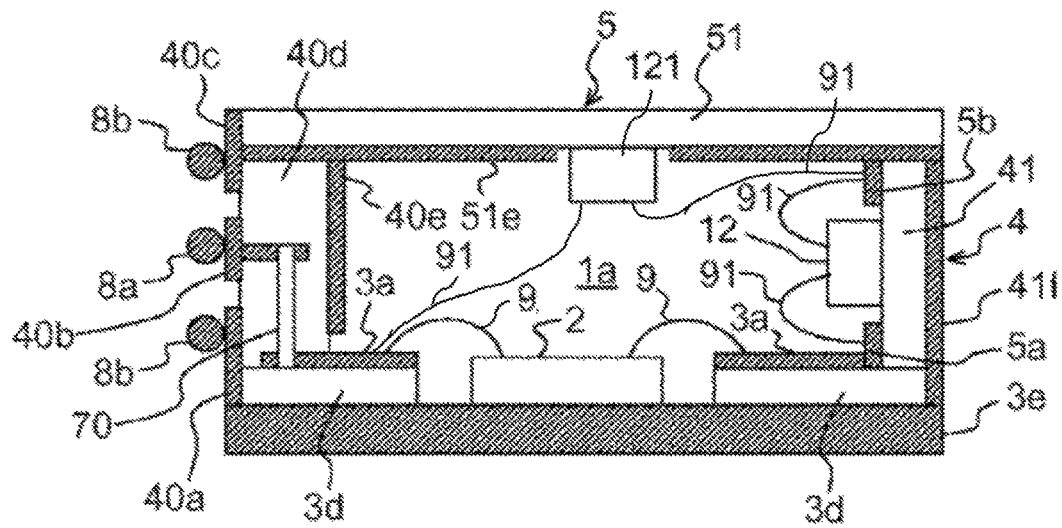

FIG. 5 presents another variant embodiment in which the walls themselves include one or a plurality of pads for receiving components. In the embodiment of FIG. 5, a wall 4 bears a component 12. The wall 4 is for example formed such as in the example of FIG. 4. In the example of FIG. 5, the component 12 is situated on the insulation 41 of the wall 4, its RF frequency signal and low frequency signal inputs and outputs being linked by interconnection wires 91 to a track 5a situated on the insulation 41 of the wall 4 and being linked electrically to the track 3a of the base, which is itself linked electrically to balls 8a such as described previously.

Other interconnection wires 91 link the ground of the component to a ground track 5b, which is itself linked electrically to the other ground surfaces.

By producing the cover 5 with the same structure as the wall 4, it is likewise possible to provide receiving pads for mounting components 121 on the cover such as is shown in FIG. 5, as is the case for the walls. The components 121, which are for example bare chips, may be fixed by bonding or soldering. In the example of FIG. 5, the components 121 are situated on the insulation 51 of the cover. The electrical ground of the component(s) may be linked to the ground potential by an exterior conductive surface 4c of the wall 40 linked electrically to the metal layer of the cover. The RF frequency and low frequency signal inputs and output of the component may be linked electrically via interconnection wires 91 to exterior connection elements via conductive tracks or surfaces 5a, 5b of the side walls 4 or to the track 3a of the base.

Figure 6:
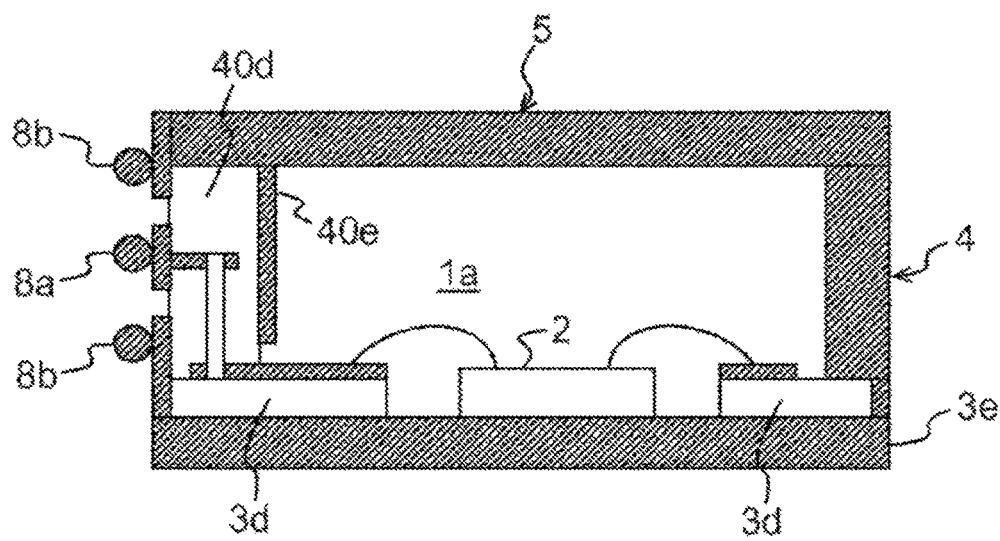

FIG. 6 presents another possible variant embodiment in which the walls 4 that are not equipped with metal interconnection balls 8a, 8b are made entirely of metal. Likewise, the cover 5 may be made entirely of metal.

The invention claimed is:

1. A package, able to encapsulate at least one RF frequency component, forming a closed cavity of Faraday cage type having side walls resting on a base and that are surmounted by a cover, wherein at least one of said side walls includes exterior electrical connection elements provided on an exterior face of said at least one side wall, the exterior electrical connection elements are linked electrically to an interior of said cavity, said exterior electrical connection elements being able to interconnect with an exterior circuit such that the exterior face of said at least one side wall faces said exterior circuit.

2. The package as claimed in claim 1, wherein said exterior electrical connection elements are conductive balls.

3. The package as claimed in claim 1, wherein said at least one side wall comprises an insulating material covered on an exterior side with a layer comprising a plurality of conductive surfaces that are insulated electrically from one another and covered on an interior side with a single conductive surface, said exterior electrical connection elements being fixed on said conductive surfaces.

4. The package as claimed in claim 3, wherein said exterior electrical connection elements form a monolithic block with said conductive surfaces.

5. The package as claimed in claim 3, wherein, with the base including an exterior conductive surface forming a ground, a conductive surface of said at least one side wall is linked electrically to said surface forming a ground.

6. The package as claimed in claim 1, wherein at least one of said plurality of electrical connection elements is linked electrically to the interior of said cavity by a metalized hole, said metalized hole being linked electrically by one end to the respective exterior electrical connection element and by another end to an interior conductive surface of said base.

7. The package as claimed in claim 5, wherein said base includes an interior conductive surface forming a pad for receiving said at least one RF frequency component and able to be linked electrically to a ground, said interior conductive surface being linked electrically to the exterior conductive surface of said base by at least one metalized hole passing through the insulating material of said base, said at least one RF frequency component having signal inputs and outputs connected to an interior surface of said base linked electrically to the exterior electrical connection elements.

8. The package as claimed in claim 5, wherein said base includes a part without insulating material so as to enable the mounting of said at least one RF frequency component directly on the exterior conductive surface of said base.

9. The package as claimed in claim 1, wherein at least one other side wall comprises an insulating material covered with at least one conductive layer.

10. The package as claimed in claim 1, wherein at least one other wall includes at least one receiving pad suitable for the mounting of at least one other component, said other component having signal inputs and outputs linked electrically to an interior conductive surface of said base, which is itself linked electrically to the exterior electrical connection elements.

11. The package as claimed in claim 1, wherein the other side walls are made entirely of metal.

12. The package as claimed in claim 1, wherein the cover comprises an insulating material covered with at least one conductive layer.

13. The package as claimed in claim 1, wherein the cover includes at least one receiving pad suitable for the mounting of at least one other component, said other component having inputs and outputs-linked electrically to an interior conductive surface of said base, which is itself linked electrically to the exterior electrical connection elements.

14. The package as claimed in claim 1, wherein the cover is made entirely of metal.

15. An assembly comprising a package as claimed in claim 1 and a multilayer circuit including at least one ground plane and conductive tracks, at least one metalized hole being produced in said circuit facing at least one of said exterior electrical connection elements of said package linked electrically to the ground of said at least one RF frequency component, the exterior electrical connection elements being linked to said conductive tracks, said package being mounted such that a plane of said base of said package is perpendicular to the at least one ground plane of said circuit.

* * * * *